(12) United States Patent
Klein et al.

(10) Patent No.: US 7,193,641 B2
(45) Date of Patent: Mar. 20, 2007

(54) STITCHING PREVENTION IN MULTIBEAM IMAGING FOR EXPOSING PRINTING PLATES

(75) Inventors: Thomas Klein, Wolfenbuettel (DE); Wolfgang Sievers, Kremperheide (DE)

(73) Assignee: Esko-Graphics A/S, Lystrup (DK)

( * ) Notice: Subject to any disclaimer, the term of this patent is extended or adjusted under 35 U.S.C. 154(b) by 301 days.

(21) Appl. No.: 11/022,576

(22) Filed: Dec. 22, 2004

(65) Prior Publication Data

US 2006/0125912 A1 Jun. 15, 2006

Related U.S. Application Data

(60) Provisional application No. 60/635,809, filed on Dec. 13, 2004.

(51) Int. Cl.
*B41J 2/447* (2006.01)
(52) U.S. Cl. .................................. 347/233; 358/3.26
(58) Field of Classification Search ................. 347/233; 358/3.26
See application file for complete search history.

(56) References Cited

U.S. PATENT DOCUMENTS 5,278,578 A * 1/1994 Baek et al. ................. 347/240
5,818,498 A    10/1998 Richardson et al. ........ 347/237
6,120,951 A     9/2000 Klein et al. .................... 430/30
6,597,388 B2 *  7/2003 Pierson ........................ 347/240
6,985,261 B2 *  1/2006 Klein et al. ................. 358/3.26

* cited by examiner

*Primary Examiner*—Huan Tran
(74) *Attorney, Agent, or Firm*—Dov Rosenfeld Inventek (57) ABSTRACT

A method of exposing imaging data onto a sensitized medium including exposing K sets of N of tracks on to the medium according to a corresponding part of imaging data, each successive set being a pixel distance apart in a fast scan direction. The method further includes exposing L sets of N tracks onto the medium with an offset of M pixels in a slow scan direction substantially perpendicular to the fast scan direction, according to a second corresponding part of imaging data. The method includes repeating alternately exposing K sets and L sets of N tracks until the complete medium is exposed along the fast scan direction. During or after the alternately exposing K sets and L sets, there is progression in the slow scan direction such that after exposing the complete length of N tracks of exposed pixels, the next N tracks match along the medium at the start of the next N tracks.

28 Claims, 5 Drawing Sheets

STITCHING PREVENTION IN MULTIBEAM IMAGING FOR EXPOSING PRINTING PLATES

RELATED APPLICATION

The present invention claims priority of U.S. Provisional Patent Application No. 60/635,809, filed Dec. 13, 2004 to inventor Klein, titled "STITCHING PREVENTION IN MULTIBEAM IMAGING FOR EXPOSING PRINTING PLATES," and hereby incorporated herein by reference.

BACKGROUND

The present invention is related to exposing imageable material using multiple exposing beams, and in particular to processing data for computer-to-plate (CTP, C2P) ablative imaging with multiple energy beams, e.g., multiple laser beams to prevent visible stitching lines appearing between the individual multiple beam packets.

One application of ablative imaging is flexography, one of the main known printing processes. A flexographic ("flexo") plate or plate/sleeve combination, normally rubber or photopolymer plate, is fabricated in such a way that the areas corresponding to zones to be inked are geometrically higher than the areas corresponding to zones not to be inked. Contacting the flexographic plate or plate/sleeve combination with an inking roller, such as an anilox roller, inks the flexographic plate. Only the geometrically higher zones of the flexographic plate or plate/sleeve combination are inked, other areas are not inked. Subsequently, the inked flexographic plate or plate/sleeve combination is brought in contact with a substrate and the inked parts transfer ink onto the substrate, thus producing the desired image on the substrate.

Ablative media includes plates and plate/sleeve combinations that are designed for direct computer-to-plate exposing of plates according to imaging data provided in digital form. For example, ablative flexographic plates designed for CTP imaging are typically photopolymer plates that are pre-sensitized with a Laser Ablation Mask System (LAMS) coating.

Figure 1:
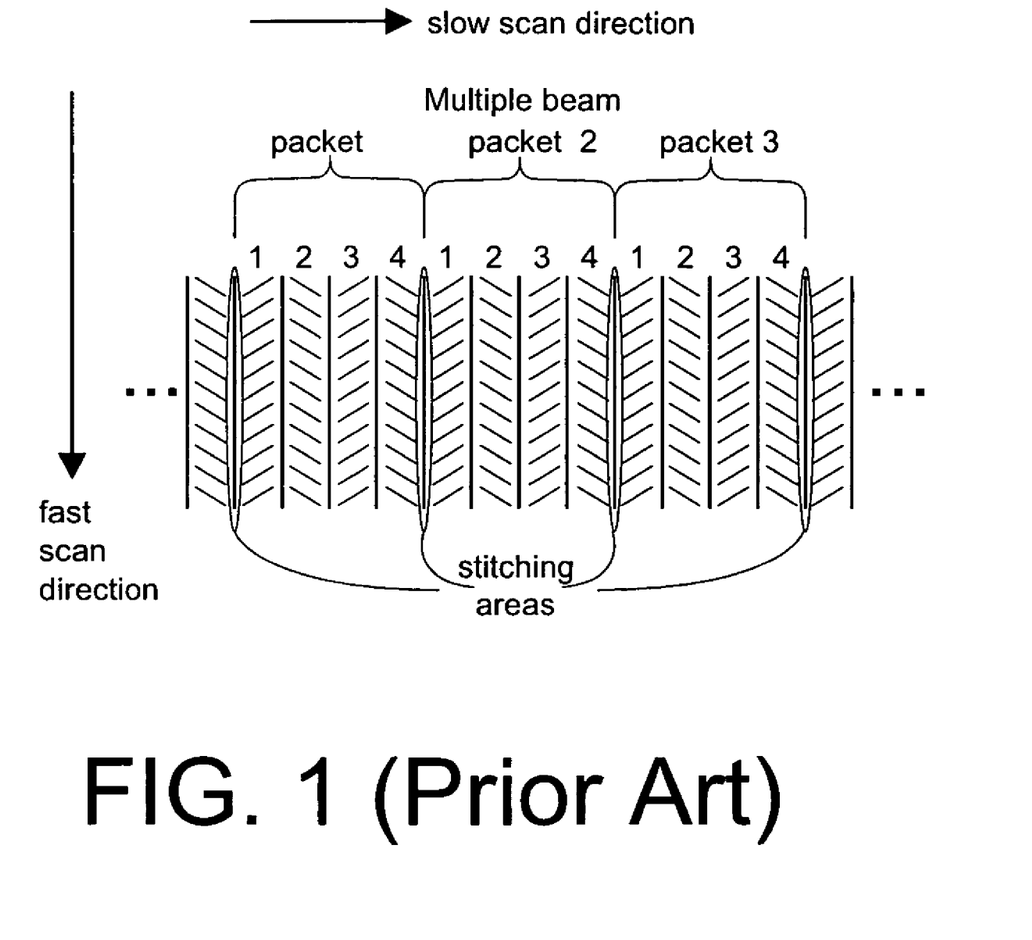
FIG. 1 shows a typical imaging exposure in which a number of beams, 4 in FIG. 1, are laid simultaneously in the fast-scan direction. This forms a packet of tracks of width four times the slow-scan-direction track separation.

There is efficiency to be gained by imaging using multiple beams. Thus, a plate is exposed by multiple beams, e.g., modulated laser energy beams that simultaneously form packets of tracks on the plate. Relative motion is produced between the plate and the multiple beams in both a fast scan direction in which several tracks are laid simultaneously, and a slow scan direction substantially perpendicular to the fast scan direction. FIG. 1 shows a typical imaging exposure in which a number of beams, 4 in FIG. 1, are laid simultaneously in the fast-scan direction. This forms a packet of tracks of width four times the slow-scan-direction track separation.

Transferring imaging data onto a media by means of ablative imaging with multiple beam methods often results in a visible stitching line in the areas between the individual multiple beam packets. Therefore, stitching artefacts may appear in these areas, called stitching areas, near the borders of the packets of tracks, as shown in FIG. 1.

The stitching lines result in a combination of inaccurate imaging and re-condensation of ablated material on the already ablated multiple beam tracks. These stitching lines disturb the homogeneity of the imaging appearance to the human eye.

In the case of digital flexographic imaging, the stitching lines prevent the underlying photopolymer from being completely polymerised during main exposure under UV light, thus leaving fine grooves on the surface of a completely processed digital flexographic plate. Such grooves influencing the ink transfer for some substrate-ink combinations, thus are often regarded as plate defects.

Furthermore, it is thought that a regular set of grooves influences the ink transfer depending on the orientation of the grooves towards the printing direction. Typically, an orientation parallel to the printing direction results in more homogeneous ink transfer than an orientation perpendicular to the printing direction. As flexo plates are expensive, the orientation of the imaging data—and thus the orientation of the grooves—is often changed at the CTP system to reduce plate wastage. It is therefore desirable to avoid grooves being introduced by the CTP imager itself, in order to achieve consistent printing quality.

Thus there is a need in the art for a method and apparatus of exposing using multiple laser energy beams that prevents such stitching lines from becoming detectable by the human eye in the resulting plates as well as in prints made from the resulting plates.

Figure 2:
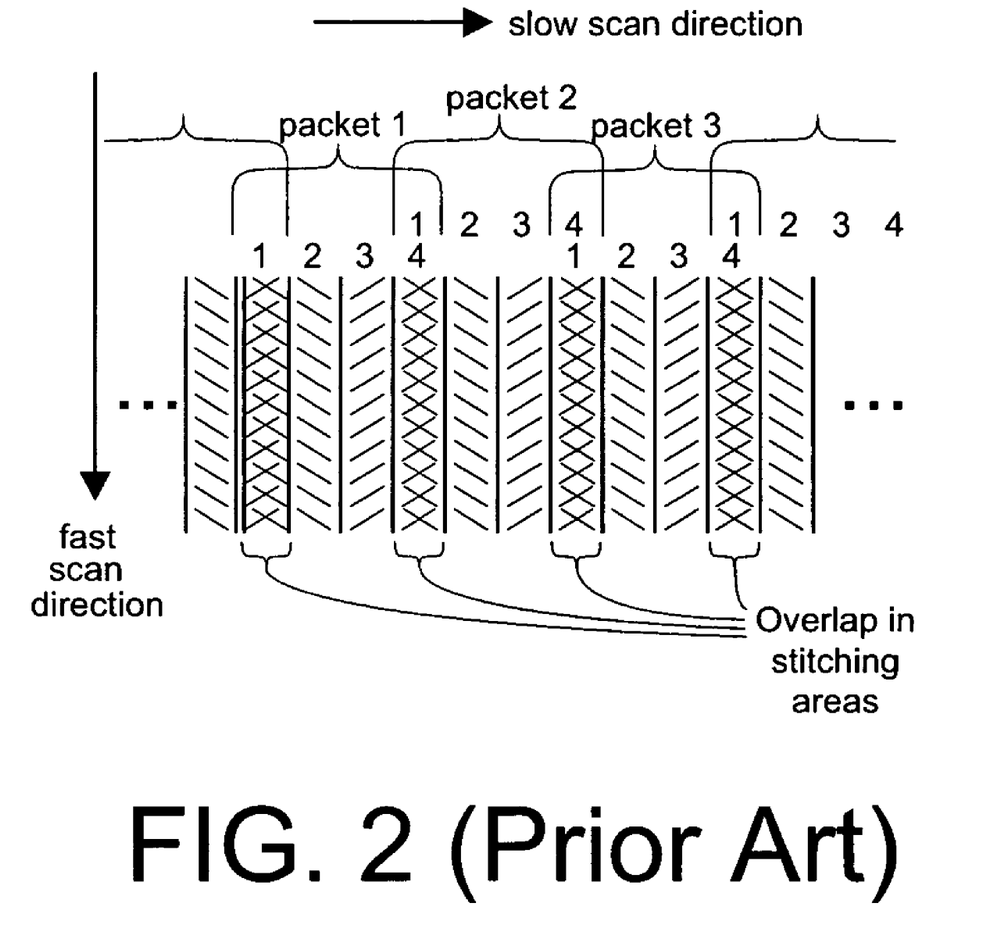
FIG. 2 shows an example of imaging using a known method that includes imaging at least one track in the stitching area at least twice, e.g., by having an area of overlap in a multi-track packet's width.

This problem has been recognized before. U.S. Pat. No. 5,818,498 to Richardson, et al. describes one method of avoiding stitching by imaging the stitching area at least twice by using more imaging beams than the actual advance in slow scan direction. FIG. 2 shows an example of imaging using the Richardson, et al approach with 4 multiple beams with a single overlap. Such Richardson, et al approach has the disadvantage that more beams are used than necessary for the imaging advance, thus the laser power has to be distributed to more channels, leading to laser power loss in each channel. If n denotes the number of tracks in the slow scan direction in each packet, e.g., 4 in FIG. 2, and m denoted the number of double imaged tracks per packet, e.g., 1 in FIG. 2, the maximum productivity of the imaging system is reduced by n/n, e.g., by ¼ in FIG. 2. This is significant when imaging using laser-power limited imaging systems such as is often the case in imaging digital flexographic plates. Furthermore, double-imaging a track with the same data on an ablative media may, and typically does result in a different appearance of such a track compared to those tracks that were imaged only once.

It is desirable to so prevent the stitching being visible without increasing the laser power used in exposure.

SUMMARY

Disclosed herein is a method of exposing imaging data onto a sensitized medium, the medium being ablative or thermally sensitive. The method includes:

exposing a first number denoted K of sets of a number denoted N of tracks on to a sensitized medium using an imaging system arranged to expose at least N tracks simultaneously on to the medium according to provided imaging data, the N tracks oriented in a slow scan direction, each successive set being a pixel distance apart in a fast scan direction, the imaging system arranged to provide relative motion between the set of tracks and the medium in the fast scan direction and to provide relative motion between the set of N tracks and the medium in the slow scan direction, the number N being at least 1, the exposing the K sets according to the corresponding part of the imaging data;

exposing a second number denoted L of sets of N tracks onto the medium with an offset of M pixels in the slow scan direction, each successive set being a pixel distance apart in a fast scan direction, the exposing based on imaging data shifted such that the exposing of the L sets matches in continuity with the previous exposing of K sets;

repeating alternately exposing K sets and L sets of N tracks until the complete medium is exposed along the fast scan direction; and during or after the alternately exposing K sets and L sets, progressing in the slow scan direction such that after exposing the complete length of N tracks of exposed pixels, the next N tracks match along the medium at the start of the next N tracks.

The method is arranged such that no pixel location is exposed more than once, and such that the visibility of exposure differences between adjacent N imaging tracks recorded by the imaging system on the medium is reduced compared to continually recording a number of tracks for a complete medium distance in the fast scan direction.

Also disclosed is a carrier medium carrying computer readable code segments to instruct a processor or processors of a processing system to execute the method described above.

Also disclosed herein is an imaging apparatus to expose an ablative or thermal sensitive media according to imaging data. The apparatus includes:

a laser output imaging device to direct a number N of beams, onto the media, N being at least one, the N beams on the media modulated according to the imaging data, and in the case that there is a plurality of beams simultaneously exposing the media, the plurality of imaging beams being oriented on to the media in a slow scan direction;

a first mechanism to provide relative motion between the N beam or beams on the media and the media in a fast scan direction substantially perpendicular to the slow scan direction, such that during relative motion in the fast scan direction, a packet of N modulated beam or beams is directed onto the media;

a second mechanism to provide relative motion between the N modulated beam or beams on the media and the media in the slow scan direction; and a controller coupled to the first and second mechanisms.

The controller is arranged to accept the imaging data and to selects appropriate imaging data to the laser output imaging device to modulate the appropriate beam at the appropriate time to expose the medium such that the apparatus writes a number K of sets of N pixels onto the medium based upon a first block of imaging data, K being at least one, the controller proceeding to accept imaging data to expose at a next position in fast scan direction after the K sets of N pixels are written.

The controller further is arranged such that the apparatus then writes L sets of N pixels onto the medium based upon a second block of imaging data while the N pixels being written are together offset by M pixels in the slow scan direction compared to the writing of the K sets according to the first block of imaging data, the controller proceeding to accept imaging data to expose at a next position in fast scan direction after the L sets of N pixels are written.

The controller further is arranged such that there is repeated alternately exposing K sets and L sets of N tracks until the complete medium is exposed along the fast scan direction.

The controller is arranged to produce relative motion in the slow scan direction during or after the alternately exposing K sets and L sets such that after exposing the complete length the N tracks of exposed pixels, the next N tracks match along the medium at the start of the next N tracks.

When K and L are small compared to N, the vertical stitching lines that occur along fast scan direction, are already broken up into some irregular structure that makes them less visible to the human eye and also makes ink distribution less depending on the orientation towards printing direction. The inventor has found that when K and L are about N/2, the irregularity are relatively frequent, and the stitching become relatively less visible. Furthermore, the printing result gets independent from the orientation of fast imaging direction towards printing direction.

DETAILED DESCRIPTION

One aspect of the invention is preventing stitching lines from being visible to the human eye by breaking up the regularity of the region of the stitching line.

One embodiment includes shifting the beam packets into each other, such that each picture element (pixel) is imaged only once. The shifting mechanism causes the line between packets to be "broken up" or irregular. The inventor has found this causes the line between packets to become less visible to the human eye. Thus the overall imaging quality of images formed from the exposed ablative medium is increased.

In one embodiment, the shifting includes shifting in the slow scan direction. The amount of slow-scan-direction shifting, e.g., the number of tracks by which there is a shift may be modified to adapt to different situations, e.g., different medium types, and/or different optical characteristics of the imaging device used.

In one embodiment, the scan after shifting in the slow-scan direction is for a particular length of progression, e.g., an integral number denoted L of pixels, in the fast scan direction. Furthermore, in one embodiment, the non-shifted scan continues for an amount of progression, e.g., an integral number denoted K of pixels, in the fast scan direction before the next shift. Thus, for an imaging system designed to image at least a number N of tracks simultaneously, N at least one, and the N (if more than 1) tracks oriented in the slow-scan direction, K sets of N pixels are imaged in a progression of K pixels in the fast scan direction, the L sets of N pixels are imaged with an offset in the slow scan direction of a number, denoted M, of pixels, M at least one.

The shifted and unshifted sets alternate until a complete length in the fast scan direction of the medium has occurred.

In one embodiment, L and K are equal.

The numbers L, K, and M may be modified to adapt to different situations, e.g., different medium types, and/or different optical characteristics of the imaging device used. Furthermore, L and K and M need not be fixed for the whole length of the packet of N scan lines (N≧1). In one implementation, L and K each change in a random-like (pseudorandom) manner that is known to the controller controlling the imaging.

A typical multi-beam imager is arranged to include spiral advance in the slow scan direction such that when the next packet of N pixel tracks starts at the edge of the medium, it is aligned next to the previous N pixels already exposed. An alternate to spiral advance exists in imagers that advance in the slow scan direction after a packet of N tracks are imaged for the whole length of the medium in the fast scan direction.

Thus, one embodiment includes repeating alternately exposing K sets of N tracks that are not offset, and L sets of N tracks that are offset by M pixels until the complete length of the medium is exposed along the fast scan direction. In different embodiments, one or more of the numbers K, L, and M, varies as the scans progress along the fast-scan direction.

During or after the alternately exposing K sets and L sets for the whole length of the medium in the fast-scan direction, included is progressing in the slow scan direction such that after exposing the complete length of the N tracks of exposed pixels, the next N tracks match along the medium at the start of the next N tracks.

Such exposing is arranged such that no pixel location is exposed more than once, and such that the visibility of exposure differences between adjacent N imaging tracks recorded by the imaging system on the medium is reduced compared to continually recording a number of tracks for a complete medium distance in the fast scan direction.

With so shifting such that each pixel is imaged only once, the maximum productivity of the imaging system is maintained, and is useful, e.g., in laser-power limited operation. Furthermore, the general appearance of imaging results is more uniform compared to such methods that include imaging some of the pixels more than once, e.g., as abovementioned Richardson, et al. method.

Figure 3:
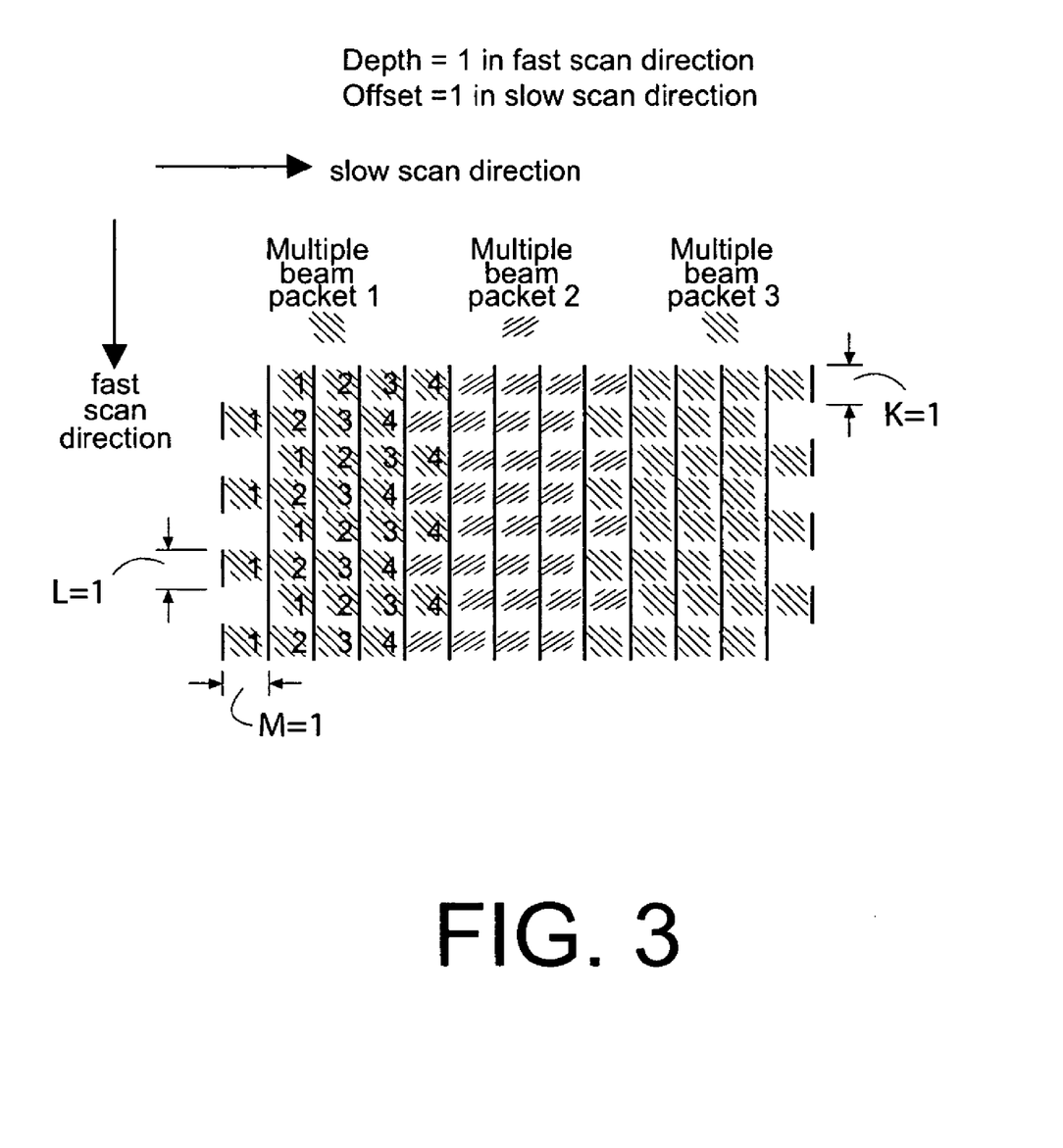
FIG. 3 shows an example of imaging that incorporates at least one aspect of the invention. Shown is a simplified drawing of three multi-track packets exposed for the case of each packet having 4 pixel tracks written simultaneously.

FIG. 3 shows a simplified drawing of three multi-track packets: packet 1, packet 2, and packet 3, for the case of each packet having N=4 pixel tracks written simultaneously. L=K, and is called the depth. In the case shown, the depth (L or K) is 1, and the offset M is 1 pixel.

Figure 4A:
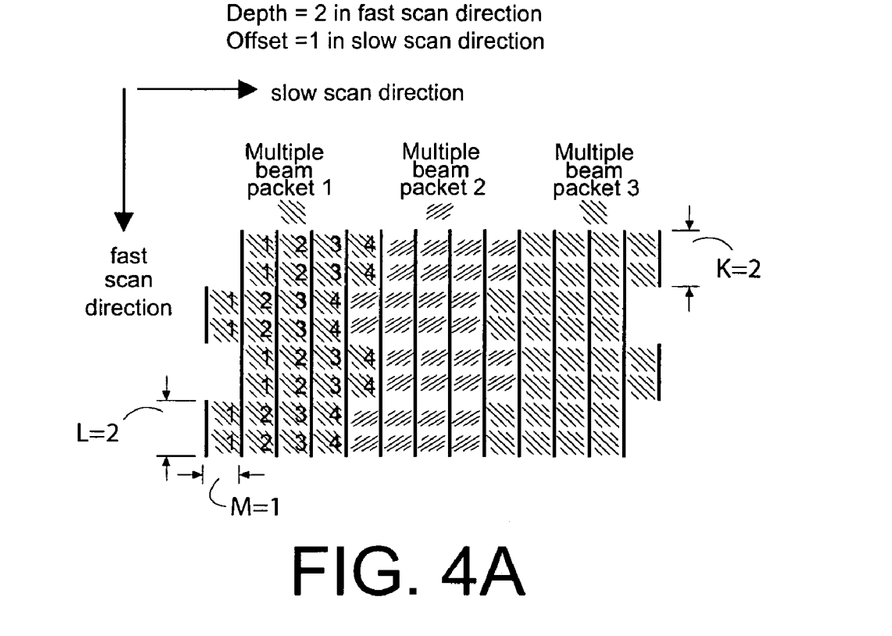
FIGS. 4A and 4B show further examples of imaging that incorporates at least one aspect of the invention's other versions. Like FIG. 3, each shows a simplified drawing of three multi-track packets with each packet having 4 pixel tracks written simultaneously. The parameters for exposing the tracks are different than in the case of FIG. 3.
Figure 4B:
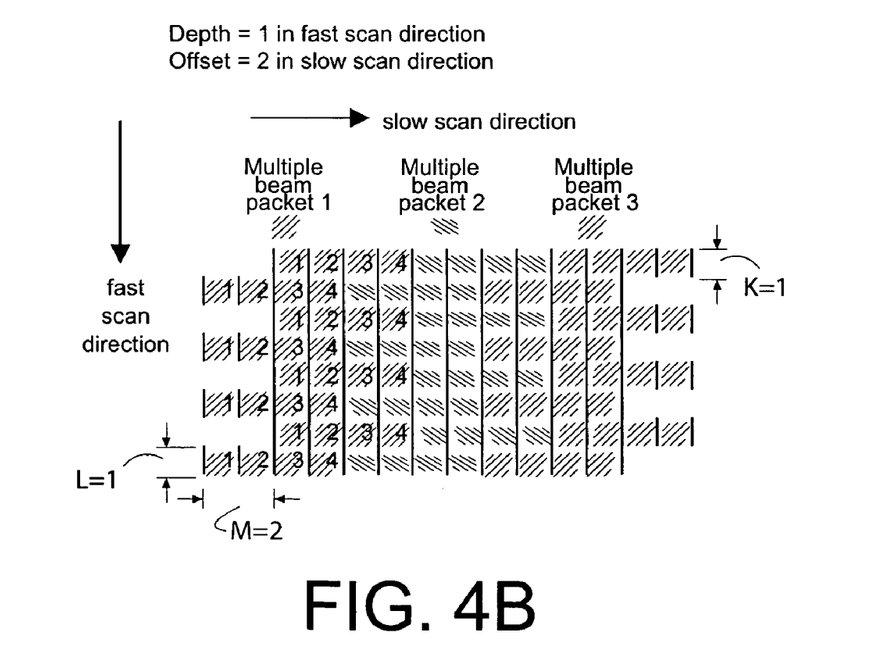

FIGS. 4A and 4B show other versions. Each shows a simplified drawing of three multi-track packets: packet 1, packet 2, and packet 3, for the case of each packet having N=4 pixel tracks written simultaneously. L=K, and is the depth. FIG. 4A shows a case of the depth L=K=2, and an offset M of 1 pixel. FIG. 4B shows the case of the depth L=K=1, and the offset M=2 pixels.

The inventor has found that there is advantage to using an offset that is equal to the value of K and of L (when K=L). This is seen in FIG. 3. In some imaging and/or printing situations, the inventor has found that there also is advantage to changing the offset to be twice the value of K and L (when K=L). This is seen in FIG. 4B.

In one embodiment, the inventor has found it useful to choose the offset M to be approximately equal to N/2. This breaks up the regular vertical line structure of the stitching completely and introduces a kind of a grid pattern, which is hardly detectably by the human eye and furthermore makes the ink transfer substantially independent of the orientation of the plate towards the printing—the fast scan—direction. In some imaging and/or printing situations, it is also advantageous to also choose K and L approximately equal to M.

One embodiment of an imaging apparatus to expose an ablative or thermal sensitive media according to imaging data includes a laser output imaging device to direct at least one imaging beam, and in a particular embodiment, more than one imaging beams onto the media. The number of beams is denoted by N. The beams on the media are modulated according to the imaging data, and in the case there is a plurality of beams simultaneously exposing the media, the imaging beams are oriented on to the media in a slow scan direction. The apparatus further includes a first mechanism to provide relative motion between the beams on the media and the media in a fast scan direction substantially perpendicular to the slow scan direction, such that during relative motion in the fast scan direction, a packet of at least one modulated beam is directed onto the media. The apparatus further includes a second mechanism to provide relative motion between the modulated beams on the media and the media in the slow scan direction.

The first and second mechanisms are coupled to a controller. The controller also accepts the imaging data and selects appropriate imaging data to the laser output imaging device to modulate the appropriate beam at the appropriate time to expose the medium as follows.

The controller is arranged such that the apparatus writes K sets of N pixels onto the medium based upon a first block of imaging data, the controller proceeding to accept imaging data to expose at a next position in fast scan direction after the K sets of N pixels are written.

The controller is further arranged such that the apparatus then writes L sets of N pixels onto the medium based upon a second block of imaging data while the tracks being written are together offset by M pixels in the slow scan direction compared to the writing of the K sets according to the first block of imaging data, the controller proceeding to accept imaging data to expose at a next position in fast scan direction after the L sets of N pixels are written.

The controller is arranged such that there is repeated alternately exposing K sets and L sets of N tracks until the complete medium is exposed along the fast scan direction. K and L can change between alternate exposing of sets. The controller is arranged to produce relative motion in the slow scan direction during or after the alternately exposing K sets and L sets such that after exposing the complete length of N tracks of exposed pixels, the next N tracks match along the medium at the start of the next N tracks. Thus, offsets and shifts in the slow scan direction are introduced at the same positions as the next packet of scan lines (tracks) to fit with the previous packets line in such a way that the complete surface of the medium is covered.

In one embodiment, K, L and M remain fixed during the exposing of a packet of N tracks along the whole length of the medium in the fast scan direction. However, there is greater irregularity possible if K, L and M vary along the length of the medium in the fast scan direction. In one embodiment, changes in any of K, L and/or M only occur in between the exposing of K or L sets of N pixels. The controller has knowledge of the values of K, L and M, and thus provides the correct block of pixels to the laser output imaging device for modulation and imaging.

In one embodiment, K or L or both K and L changes between alternate exposing of sets of N pixels while imaging proceeds in the fast scan direction. Furthermore, the offset M can change. In a first version, at least one of K, L M changes according to a regular scheme while imaging proceeds in the fast scan direction. In a second version, at least one of K, L M changes according to a stochastic scheme while imaging proceeds in the fast scan direction. Whether regular or stochastic, the changes in the at least one of K, L, and/or M are known to the controller so that the correct pixels are exposed at the appropriate locations. For example, in the case of a stochastic scheme, the stochastic scheme is known to the controller, and, for example, is based in pseudorandom sequences.

A first embodiment of so shifting in the slow scan direction is applicable to a multichannel imager that produces a number of channels. Let the maximum number of channels of the multichannel imager be $N_0$ such that the imager can simultaneously image at most $N_0$ tracks. At any time, a smaller number, denoted N, of channels than $N_0$, the total available is used to image a smaller number of tracks than possible with the imager. One example of such an imaging system uses an array of $N_0$ thermal diodes that are fiber coupled to produce at most $N_0$ multiple beams. A first embodiment of the method includes imaging a lesser number N, with $N<N_0$, of channels at a time to output image data. The remaining $N_0-N$ channels are used to implement the shifting in the slow scan direction while there is relative motion in the fast scan direction between the beams and the imaged medium, e.g., the LAM covered flexographic plate. In one version, the shift is the maximum possible, such that $M=N_0-N$. In another, $N_0-N>1$ and at least two values of M may be used.

Figure 5:
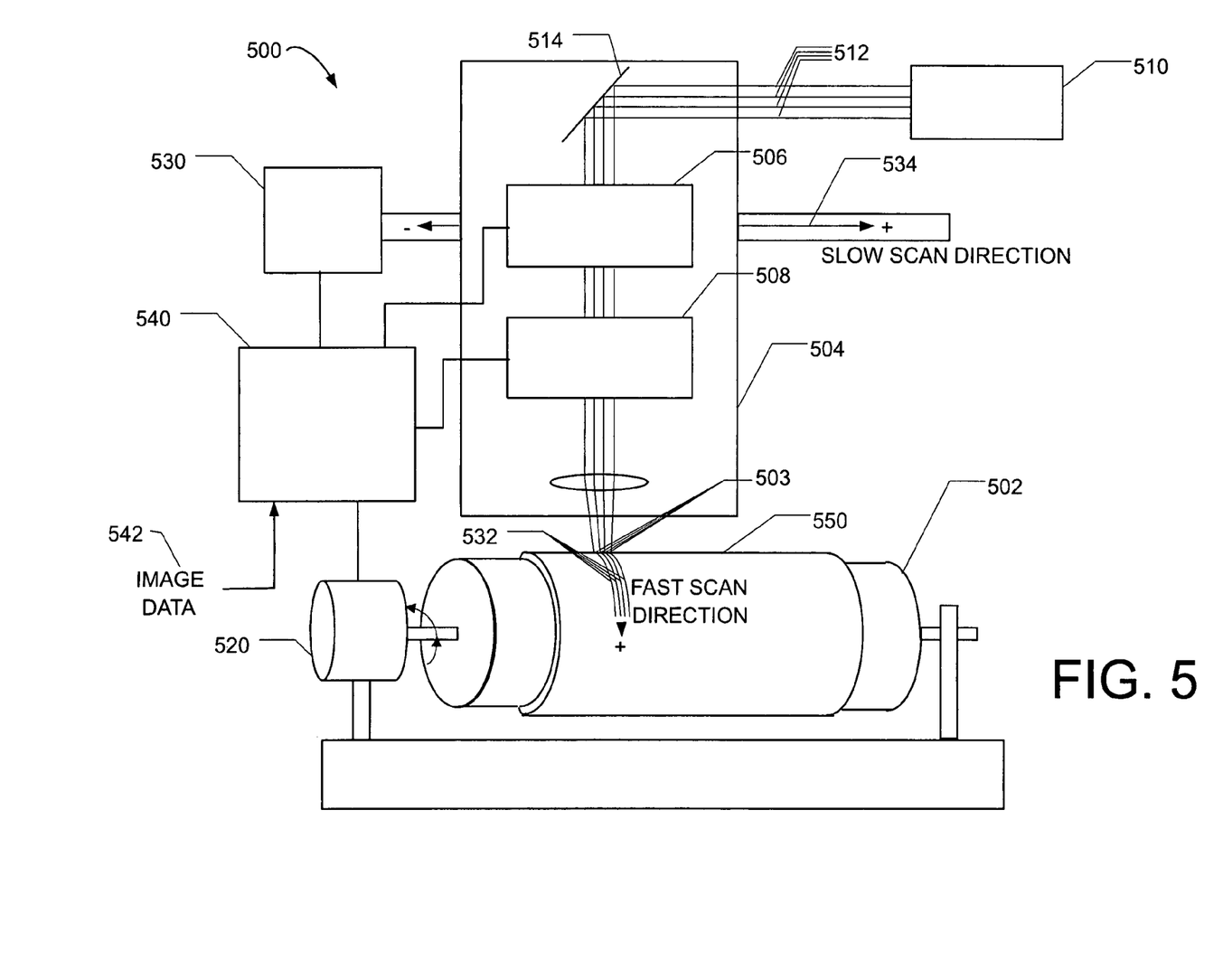
FIG. 5 shows one embodiment of an imaging apparatus that includes at least one aspect of the present invention.

A second embodiment of so shifting in the slow-scan direction is applicable, for example, to imagers that use a multichannel acousto-optical modulator (AOM) modulated by a plurality of image data streams, or equivalently an array of individual AOMs modulated by the plurality of image data streams. As is known in the art, an AOM is driven by one or more radiofrequency (RF) signals. FIG. 5 illustrates as a simple block diagram one embodiment of a laser beam external drum imagesetter 500. The laser beam imaging device includes a laser beam source 510 to form a plurality of laser beams, an imaging head 504 arranged to receive the plurality of laser beams, to modulate the beams according to imaging data, and to focus the modulated laser beams onto an array of focal spots 503, the array oriented in a slow-scan direction 534 on the surface of a flexographic plate or plate/sleeve combination 550 to form tracks on the surface as the plate or plate/sleeve combination rotates in the fast-scan direction 532. The imaging head 504 in one embodiment includes a reflector 514 to direct the laser beams from the laser beam source 510 to a deflector 506. The laser beams pass through the deflector 506 to a multichannel AOM 508 that modulates the beams according to the imaging data. The imagesetter further includes a controller 540 that controls the device 500. The controller comprises a programmable microcontroller in the form of a microprocessor, and a memory that includes instructions for the microprocessor. The image data 542 is input to the controller 540, and the multichannel AOM 508 receives image data 542 from the controller 540 and modulates the laser beams 512 with the image data 542. The AOM 508 and deflector 506 work together in the imaging head to direct the modulated laser beams to the surface of the flexo plate or plate/sleeve combination 550 at the focal points 503. Note that the deflector 506 in imaging head 504 is shown preceding the multichannel AOM 508. Alternatively, the deflector 506 may occur after the multichannel AOM 508, or may be combined with the multichannel AOM 508. The flexographic plate or plate/sleeve combination 550 is mounted on a drum 502. The drum is rotated by a fast scan motion actuator, for example a motor 520. The fast scan actuator 520 is controlled by the controller 540. A slow scan motion actuator, for example a motor 530, which in one embodiment, is a linear motor, moves the imaging unit 504 in a slow scan direction 534 as directed by the controller 540.

Thus there is a source of a laser beam, a deflector, and a modulator for each beam. A separate laser may provide each beam, for example from a laser array, or all the beams may be provided from a single laser together with a beam splitter or a multiple beam deflector, as is known in the art.

In one embodiment, the slow scan motion actuator is used to advance the imaging head 504 between one plurality of image tracks (a packet of tracks) to another. The controller 540 provides the instructions to the slow scan motion actuator 530 to move the imaging head 504 in the slow scan direction 534 from one image packet of tracks to another.

According to the second embodiment, the frequencies of the RF signal driving the acousto-optic modulator(s) is changed by a small amount, denoted $\Delta f$, with $\Delta f$ suitable to shift the entire multiple beam packet 503 focused on the surface by M pixels in the slow scan direction 534 while proceeding in the fast scan direction 532. See, for example, U.S. Pat. No. 6,120,951 to Klein, et al., titled "METHOD FOR INCREASING PRODUCTIVITY WITHOUT RESOLUTION LOSS ON IMAGESETERS" for one description of how to so shift a set of multiple beams in slow scan direction.

Note that while the above description is for multi-beam imaging that includes imaging a plurality of tracks simultaneously, the number of tracks denoted N, the method and apparatus described herein is also suitable for imaging a single track. A single line is then broken up during imaging into a line that is at times shifted in the slow-scan direction so as not to form artifacts.

Note also that the imager shown in FIG. 5 is an external drum imager. The method and system described herein is also readily implemented in a flat-bed imaging device or in an internal drum imaging device.

Note further that while the main application is for exposing an ablative sensitized medium, the method is applicable to any imaging of any ablative or thermally sensitive recording medium using a laser imaging device.

It should be appreciated that although the invention has been described in the context of flexography, and an external drum imaging device, the invention is not limited to such contexts and may be utilized in various other applications and systems.

The methodologies described herein are, in one embodiment, performed by a controller, e.g., the controller of the imaging apparatus. The controller is typically implemented by a machine that includes one or more processors that accept code segments containing instructions. For any of the methods described herein, when the instructions are executed by the machine, the machine performs the method. Any machine capable of executing a set of instructions (sequential or otherwise) that specify actions to be taken by that machine are included. Thus, one typical machine may be exemplified by a typical processing system that includes one or more processors. Each processor may include one or more of a CPU, a graphics processing unit, and a programmable DSP unit. The processing system further may include a memory subsystem including main RAM and/or a static RAM, and/or ROM. A bus subsystem may be included for communicating between the components. If the processing system requires a display, such a display may be included, e.g., a liquid crystal display (LCD) or a cathode ray tube (CRT) display. If manual data entry is required, the processing system also includes an input device such as one or more of an alphanumeric input unit such as a keyboard, a pointing control device such as a mouse, and so forth. The term memory unit as used herein also encompasses a storage system such as a disk drive unit. The processing system in some configurations may include a sounds output device, and a network interface device. The memory subsystem thus includes a carrier medium that carries machine readable code segments (e.g., software) including instructions for performing, when executed by the processing system, one of more of the methods described herein. The software may reside in the hard disk, or may also reside, completely or at least partially, within the RAM and/or within the processor during execution thereof by the computer system. Thus, the memory and the processor also constitute carrier medium carrying machine readable code.

In alternative embodiments, the machine operates as a standalone device or may be connected, e.g., networked to other machines, in a networked deployment, the machine may operate in the capacity of a server or a client machine in a server-client network environment, or as a peer machine in a peer-to-peer or distributed network environment. The machine may be a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine.

Note that while some diagram(s) only show(s) a single processor and a single memory that carries the code, those in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, one embodiment of each of the methods described herein is in the form of a computer program that executes on a processing system, e.g., a one or more processors that are part of a controller of an imaging apparatus, as appropriate. Thus, as will be appreciated by those skilled in the art, embodiments of the present invention may be embodied as a method, an apparatus such as a special purpose apparatus, an apparatus such as a data processing system, or a carrier medium, e.g., a computer program product. The carrier medium carries one or more computer readable code segments for controlling a processing system to implement a method. Accordingly, aspects of the present invention may take the form of a method, an entirely hardware embodiment, an entirely software embodiment or an embodiment combining software and hardware aspects. Furthermore, the present invention may take the form of carrier medium (e.g., a computer program product on a computer-readable storage medium) carrying computer-readable program code segments embodied in the medium.

The software may further be transmitted or received over a network via the network interface device. While the carrier medium is shown in an exemplary embodiment to be a single medium, the term "carrier medium" should be taken to include a single medium or multiple media (e.g., a centralized or distributed database, and/or associated caches and servers) that store the one or more sets of instructions. The term "carrier medium" shall also be taken to include any medium that is capable of storing, encoding or carrying a set of instructions for execution by the machine and that cause the machine to perform any one or more of the methodologies of the present invention. A carrier medium may take many forms, including but not limited to, non-volatile media, volatile media, and transmission media. Non-volatile media includes, for example, optical, magnetic disks, and magneto-optical disks. Volatile media includes dynamic memory, such as main memory. Transmission media includes coaxial cables, copper wire and fiber optics, including the wires that comprise a bus subsystem. Transmission media also may also take the form of acoustic or light waves, such as those generated during radio wave and infrared data communications. For example, the term "carrier medium" shall accordingly be taken to included, but not be limited to, solid-state memories, optical and magnetic media, and carrier wave signals.

It will be understood that the steps of methods discussed are performed in one embodiment by an appropriate processor (or processors) of a processing (i.e., computer) system executing instructions (code segments) stored in storage. It will also be understood that the invention is not limited to any particular implementation or programming technique and that the invention may be implemented using any appropriate techniques for implementing the functionality described herein. The invention is not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

All publications, patents, and patent applications cited herein are hereby incorporated by reference.

In the claims below and the description herein, any one of the terms comprising, comprised of or which comprises is a an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims or elsewhere herein, should not be interpreted as being limitative to direct connections only. Thus, the scope of the expression a device A coupled to a device B should not be limited to devices or systems wherein an output of device A is directly connected to an input of device B. It means that there exists a path between an output of A and an input of B which may be a path including other devices or means.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. An apparatus for exposing imaging data onto a sensitized medium, the apparatus comprising:

means for exposing a first number denoted K of sets of a number denoted N of tracks on to a sensitized medium using, the means for exposing arranged to expose at least N tracks simultaneously on to the medium according to provided imaging data, the N tracks oriented adjacent to each other in a slow scan direction, each successive N-track set of the K-sets being a pixel distance apart in a fast scan direction, the imaging system arranged to provide relative motion between the set of tracks and the medium in the fast scan direction and to provide relative motion between the set of N tracks and the medium in the slow scan direction, the number N being at least 1, the exposing of the K sets according to the corresponding part of the imaging data;

means for exposing a second number denoted L of sets of N tracks onto the medium with an offset of M pixels in the slow scan direction, each successive N-track set of the L-sets being a pixel distance apart in a fast scan direction, the exposing based on imaging data shifted such that the exposing of the L sets matches in continuity with the previous exposing of K sets;

means for repeating alternately exposing K sets and L sets of N tracks until the complete length in the fast scan direction of the medium is exposed; and means for progressing in the slow scan direction during or after the alternately exposing K sets and L sets, such that after exposing the complete length of N tracks of exposed pixels, the next N tracks match along the medium at the start of the next N tracks, such that no pixel location is exposed more than once, and such that the visibility of exposure differences between adjacent N imaging tracks recorded by the imaging system on the medium is reduced compared to continually recording a number of tracks for a complete medium distance in the fast scan direction.

2. A carrier medium carrying computer readable code segments to instruct one or more processors of a processing system to execute a method of exposing imaging data onto a sensitized medium, the method comprising:

exposing a first number denoted K of sets of a number denoted N of tracks on to a sensitized medium using an imaging system arranged to expose at least N tracks simultaneously on to the medium according to provided imaging data, the N tracks oriented adjacent to each other in a slow scan direction, each successive N-track set of the K-sets being a pixel distance apart in a fast scan direction, the imaging system arranged to provide relative motion between the set of tracks and the medium in the fast scan direction and to provide relative motion between the set of N tracks and the medium in the slow scan direction, the number N being at least 1, the exposing of the K sets according to the corresponding part of the imaging data;

exposing a second number denoted L of sets of N tracks onto the medium with an offset of M pixels in the slow scan direction, each successive N-track set of the L-sets being a pixel distance apart in a fast scan direction, the exposing based on imaging data shifted such that the exposing of the L sets matches in continuity with the previous exposing of K sets;

repeating alternately exposing K sets and L sets of N tracks until the complete length in the fast scan direction of the medium is exposed medium is exposed; and during or after the alternately exposing K sets and L sets, progressing in the slow scan direction such that after exposing the complete length of N tracks of exposed pixels, the next N tracks match along the medium at the start of the next N tracks, such that no pixel location is exposed more than once, and such that the visibility of exposure differences between adjacent N imaging tracks recorded by the imaging system on the medium is reduced compared to continually recording a number of tracks for a complete medium distance in the fast scan direction.

3. A method of exposing imaging data onto a sensitized medium, the method comprising:

exposing a first number denoted K of sets of a number denoted N of tracks on to a sensitized medium using an imaging system arranged to expose at least N tracks simultaneously on to the medium according to provided imaging data, the N tracks oriented adjacent to each other in a slow scan direction, each successive N-track set of the K-sets being a pixel distance apart in a fast scan direction, the imaging system arranged to provide relative motion between the set of tracks and the medium in the fast scan direction and to provide relative motion between the set of N tracks and the medium in the slow scan direction, the number N being at least 1, the exposing of the K sets according to the corresponding part of the imaging data;

exposing a second number denoted L of sets of N tracks onto the medium with an offset of M pixels in the slow scan direction, each successive N-track set of the L-sets being a pixel distance apart in a fast scan direction, the exposing based on imaging data shifted such that the exposing of the L sets matches in continuity with the previous exposing of K sets;

repeating alternately exposing K sets and L sets of N tracks until the complete length in the fast scan direction of the medium is exposed; and during or after the alternately exposing K sets and L sets, progressing in the slow scan direction such that after exposing the complete length of the N tracks of exposed pixels, the next N tracks match along the medium at the start of the next N tracks, such that no pixel location is exposed more than once, and such that the visibility of exposure differences between adjacent N imaging tracks recorded by the imaging system on the medium is reduced compared to continually recording a number of tracks for a complete medium distance in the fast scan direction.

4. A method as recited in claim 3, wherein K and L are equal.

5. A method as recited in claim 4, wherein K and L are both equal to one.

6. A method as recited in claim 4, wherein the offset M is equal to the value of K.

7. A method as recited in claim 4, wherein the offset M is equal to the twice value of K.

8. A method as recited in claim 4, wherein the offset M is equal to N/2.

9. A method as recited in claim 8, wherein each of K and L is equal to N/2.

10. A method as recited in claim 3, wherein at least one of K, L and M changes between alternate exposing of sets of N pixels while imaging proceeds in the fast scan direction.

11. A method as recited in claim 10, wherein at least one of K, L and M changes according to a regular scheme while imaging proceeds in the fast scan direction.

12. A method as recited in claim 10, wherein at least one of K, L and M changes according to a stochastic scheme while imaging proceeds in the fast scan direction.

13. A method as recited in claim 3, wherein the imaging system used in the exposing includes an acousto-optical modulator, the modulator having one modulating channel per imaging beam, the acousto-optical modulator driven by one or more RF signals, and wherein the shift by M pixels in the slow scan direction is realized by the controller causing a frequency offset to be added or subtracted to all frequencies of RF driving signals of the acousto-optics modulator.

14. A method as recited in claim 3, wherein the imaging system used in the exposing is capable of simultaneously directing at least M+N modulated beams onto the medium, and wherein the shift in the slow scan direction is realized by selecting an appropriate subset of N channels of the at least N+M possible channels for imaging the N pixels simultaneously.

15. An imaging apparatus to expose an ablative or thermal sensitive medium according to imaging data, the apparatus comprising:

a laser output imaging device to direct a number N of beams, onto the media, N being at least one, the N beams on the media modulated according to the imaging data, and in the case that there is a plurality of beams simultaneously exposing the media, the plurality of imaging beams being oriented on to the media in a slow scan direction;

a first mechanism to provide relative motion between the N beam or beams on the media and the media in a fast scan direction substantially perpendicular to the slow scan direction, such that during relative motion in the fast scan direction, a packet of N modulated beam or beams is directed onto the media;

a second mechanism to provide relative motion between the N modulated beam or beams on the media and the media in the slow scan direction; and a controller coupled to the first and second mechanisms, the controller arranged to accept the imaging data and to select appropriate imaging data to the laser output imaging device to modulate the appropriate beam at the appropriate time to expose the medium such that the apparatus writes a number K of sets of N pixels onto the medium based upon a first block of imaging data, K being at least one, the controller proceeding to accept imaging data to expose at a next position in fast scan direction after the K sets of N pixels are written, the controller further is arranged such that the apparatus then writes L sets of N pixels onto the medium based upon a second block of imaging data while the N pixels being written are together offset by M pixels in the slow scan direction compared to the writing of the K sets according to the first block of imaging data, the controller proceeding to accept imaging data to expose at a next position in fast scan direction after the L sets of N pixels are written, the controller further is arranged such that there is repeated alternately exposing K sets and L sets of N tracks until the complete medium is exposed along the fast scan direction, the controller being arranged to produce relative motion in the slow scan direction during or after the alternately exposing K sets and L sets such that after exposing the complete length the N tracks of exposed pixels, the next N tracks match along the medium at the start of the at next N tracks.

16. An apparatus as recited in claim 15, wherein K and L are equal.

17. An apparatus as recited in claim 16, wherein K and L are both equal to one.

18. An apparatus as recited in claim 16, wherein the offset M is equal to the value of K.

19. An apparatus as recited in claim 16, wherein the offset M is equal to the twice the value of K.

20. An apparatus as recited in claim 16, wherein the offset M is equal to N/2.

21. An apparatus as recited in claim 20, wherein each of K and L is equal to N/2.

22. An apparatus as recited in claim 15, wherein at least one of K, L and M changes between alternate exposing of sets of N pixels while imaging proceeds in the fast scan direction.

23. A method as recited in claim 10, wherein at least one of K, L and M changes according to a regular scheme while imaging proceeds in the fast scan direction.

24. A method as recited in claim 10, wherein at least one of K, L and M changes according to a stochastic scheme while imaging proceeds in the fast scan direction.

25. An apparatus as recited in claim 15, wherein the imaging device includes an acousto-optical modulator, the modulator having one modulating channel per imaging beam, the acousto-optical modulator driven by one or more RF signals, and wherein the shift by M pixels in the slow scan direction is realized by the controller causing a frequency offset to be added or subtracted to all frequencies of RF driving signals of the acousto-optics modulator.

26. An apparatus as recited in claim 15, whereas the wherein the imaging device is capable of simultaneously directing at least M+N modulated beams onto the medium, and wherein the shift in the slow scan direction is realized by selecting an appropriate subset of N channels of the at least N+M possible channels for imaging the N pixels simultaneously.

27. A method of exposing imaging data onto a sensitized medium including:
   exposing K sets of N of tracks on to the medium according to a corresponding part of imaging data, each successive set being a pixel distance apart in a fast scan direction;
   exposing L sets of N tracks onto the medium with an offset of M pixels in a slow scan direction substantially perpendicular to the fast scan direction, according to a second corresponding part of imaging data;
   repeating alternately exposing K sets and L sets of N tracks until the complete medium is exposed along the fast scan direction; and
   during or after the alternately exposing K sets and L sets, progressing in the slow scan direction such that after exposing the complete length of the N tracks of exposed pixels, the next N tracks match along the medium at the start of the next N tracks.

28. An apparatus of exposing imaging data onto a sensitized medium including:
   means for exposing K sets of N of tracks on to the medium according to a corresponding part of imaging data, each successive set being a pixel distance apart in a fast scan direction;
   means for exposing L sets of N tracks onto the medium with an offset of M pixels in a slow scan direction substantially perpendicular to the fast scan direction, according to a second corresponding part of imaging data;
   means for repeating alternately exposing K sets and L sets of N tracks until the complete medium is exposed along the fast scan direction; and
   means for progressing in the slow scan direction during or after the alternately exposing K sets and L sets, such that after exposing the complete length of N tracks of exposed pixels, the next N tracks match along the medium at the start of the next N tracks.

* * * * *

UNITED STATES PATENT AND TRADEMARK OFFICE
CERTIFICATE OF CORRECTION

| | | |
|---|---|---|
| PATENT NO. | : 7,193,641 B2 | Page 1 of 1 |
| APPLICATION NO. | : 11/022576 | |
| DATED | : March 20, 2007 | |
| INVENTOR(S) | : Klein et al. | |

It is certified that error appears in the above-identified patent and that said Letters Patent is hereby corrected as shown below:

In column 2, line 36, kindly change "by n/n," to --by m/n,--.

Signed and Sealed this

First Day of May, 2007

JON W. DUDAS
*Director of the United States Patent and Trademark Office*